United States Patent [19]

Müller et al.

[11] 4,097,740

[45] Jun. 27, 1978

[54] METHOD AND APPARATUS FOR FOCUSING THE OBJECTIVE LENS OF A SCANNING TRANSMISSION-TYPE CORPUSCULAR-BEAM MICROSCOPE

[75] Inventors: Karl-Heinz Müller; Reinhard Schliepe; Volker Rindfleisch, all of Berlin, Germany

[73] Assignee: Siemens Aktiengesellschaft, Berlin and Munich, Germany

[21] Appl. No.: 721,693

[22] Filed: Sep. 9, 1976

[30] Foreign Application Priority Data

Sep. 19, 1975 Germany .............................. 2542356

[51] Int. Cl.² .......................................... H01J 37/26
[52] U.S. Cl. ..................................... 250/311; 250/397
[58] Field of Search ................. 250/311, 309, 397, 307

[56] References Cited

U.S. PATENT DOCUMENTS

| | | | |
|---|---|---|---|
| 3,146,335 | 8/1964 | Samuelson | 250/397 |
| 3,180,986 | 4/1965 | Grigson | 250/397 |
| 3,626,184 | 12/1971 | Crewe | 250/311 |
| 3,795,809 | 3/1974 | Takashima | 250/397 |
| 3,833,811 | 9/1974 | Koike et al. | 250/397 |
| 3,908,124 | 9/1975 | Rose | 250/311 |
| 3,919,550 | 11/1975 | Banbury | 250/311 |

*Primary Examiner*—Bruce C. Anderson

*Attorney, Agent, or Firm*—Kenyon & Kenyon, Reilly, Carr & Chapin

[57] ABSTRACT

A method and apparatus for focusing the objective lens of a scanning transmission-type corpuscular-beam microscope. In the method, the beam of the microscope is deflected by a deflection system excited in sawtooth fashion and generates a raster consisting of parallel lines on the specimen to be examined. The microscope includes a beam radiation detector disposed behind the specimen along the beam path which generates an output signal which controls the brightness of a picture tube monitor operated synchronously with the raster. The improvement of the invention comprises the steps of measuring, during the exposure of a specimen point, partial beam radiation intensities in the cone of the beam at two points disposed symmetrical with respect to the longitudinal axis of the beam cone by means of the detector, the effective input area of the detector being smaller than the cross-sectional area of the cone of the beam at the same height in the microscope. The lens current of the objective lens is then adjusted so that the output signals generated by the detector are equal for the beam radiation measurements at the two points.

An apparatus for automatically focusing the objective lens in the foregoing manner is also disclosed.

9 Claims, 3 Drawing Figures

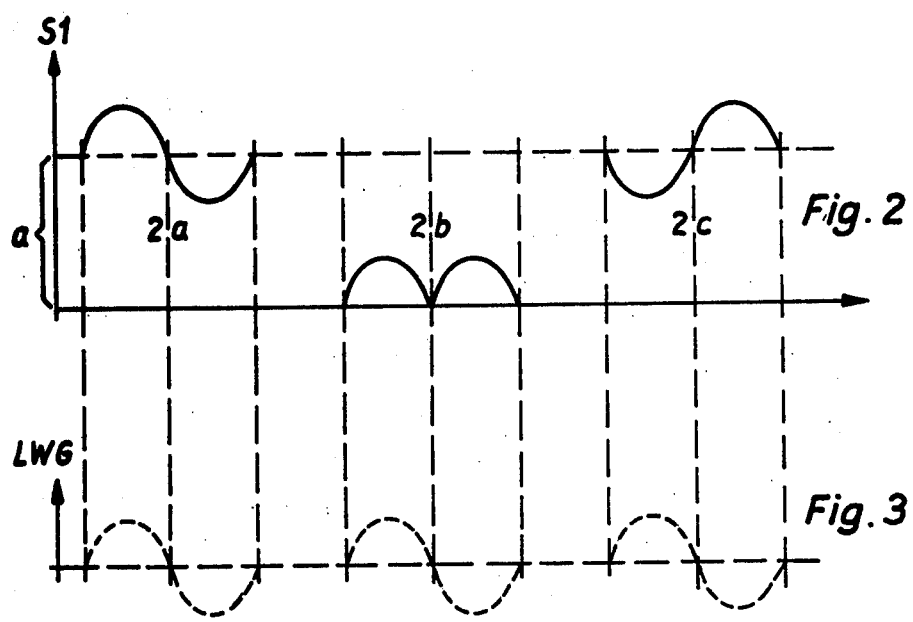

METHOD AND APPARATUS FOR FOCUSING THE OBJECTIVE LENS OF A SCANNING TRANSMISSION-TYPE CORPUSCULAR-BEAM MICROSCOPE

BACKGROUND OF THE INVENTION

Field of the Invention

This invention relates generally to corpuscular-beam microscopes, and in particular to a method and apparatus for focusing the objective lens of such a microscope.

Description of the Prior Art

Scanning transmission-type corpuscular-beam microscopes in which the beam is deflected by a deflection system excited in sawtooth fashion so that it generates, on the specimen to be examined, a raster consisting of parallel lines, and which include a beam radiation detector disposed behind the specimen along the beam path which generates an output signal which controls the brightness of a picture tube monitor operated synchronously with the raster, are known in the art. See, for example, the Journal of Applied Physics, Vol. 39, No. 13 (1968), pages 5861 ff.

SUMMARY OF THE INVENTION

It is an object of the present invention to image the reduced image of the beam source of the microscope projected by the objective lens thereof in the plane in which the specimen to be examined is disposed with the highest possible accuracy by adjusting the lens current of the microscope.

This and other objects of the invention are achieved by measuring, during the exposure of a specimen point, partial radiation intensities in that part of the cone of the microscope beam which has passed through the specimen at two points disposed symmetrically with respect to the longitudinal axis of the beam cone by means of a radiation detector having an effective input area which is smaller than the cross-sectional area of the cone at the same height, and then adjusting the lens current so that output signals generated by the detector are equal for the measurements at both points.

The invention is based on the discovery that the part of the ray cone of the beam which has passed through the specimen to be examined projects a shadow image of a larger or smaller specimen area in the plane of the detector when the focal length relative to the specimen is either too short (overfocus) or too long (underfocus). This shadow image is structured, i.e.. partial beam radiation intensities which are measured in the ray cone symmetrically with respect to both sides of the cone axis are, as a rule, different. If, however, the beam is focused on the specimen, the radiation intensity in the cone is unstructured, so that the intensities measured at symmetrical points of the cross-sectional area of the cone are equal. This is strictly accurate, however, only for non-crystalline specimens. Where crystalline specimens are examined, it is preferable to use the carrier foil, which usually consists of amorphous carbon, as a test specimen.

A pair of radiation detectors may be used to measure the radiation intensities and are disposed symmetrically with respect to the optical axis of the microscope. Each detector has an input area which is small compared to the cross-sectional area of the cone and generates output signals which can be read, after amplification, directly on measuring instruments. The lens current in the objective lens is adjusted in this case until the measured difference between the two instruments is minimized.

The instrumentation required is generally less when one detector disposed on the optical axis is used to measure the radiation intensities and the beam cone is alternately deflected by a deflection system excited in square-wave fashion through two equal and opposite angles with respect to the optical axis of the microscope. In both cases, the radiation intensities may be measured while the deflection system which generates the specimen raster is not excited, i.e., a specimen point is illuminated by a fixed beam. In the second case, the intensities can be measured while a specimen raster is generated, so that the frequency of the deflection of the ray cone below the specimen is large compared to the line frequency of the specimen raster. This causes the time between two deflections of the ray cone to be about as long as the dot time of the specimen raster so that the output signals generated by the detector during the irradiation of a specimen point can be compared.

In the latter embodiment of the invention (i.e., that described with reference to the axially-disposed detector), measurement of the detector output signals can be reduced to an a-c measurement by amplifying the detector output signals by means of a narrow-band amplifier which is tuned to the frequency of the deflection system deflecting the bean ray cone below the specimen. An a-c current having a frequency which is low compared to the deflection frequency can be superimposed upon the lens current. The phase difference of this a-c current and the resulting modulation of the detector output signals can then be compared and can be used as the criterion for the direction of the required lens current change.

The present invention also relates to an apparatus for automatically carrying out the above-described method of the invention. In the apparatus, a radiation detector is disposed in the optical axis of the microscope behind the specimen along the beam path. Deflection means is disposed between the detector and the specimen. A deflection wobble generator which generates a square-wave output signal controls the deflection means and deflects the ray cone of the beam in two directions symmetrical with respect to the optical axis of the microscope. The frequency of the deflection wobble generator is high compared to the line frequency of the specimen raster.

The apparatus also includes a lens current regulating means which is controlled by a lens current wobble generator which superimposes an a-c current on the lens current. Finally, a phase discriminator is provided for comparing the phase between the lens current wobble generator and the output signals generated by the detector. An output signal generated by the discriminator controls the lens current regulating means.

These and other objects of the invention will be described in greater detail in the following detailed description.

BRIEF DESCRIPTION OF THE DRAWINGS

In the drawings, wherein similar reference numerals denote similar elements throughout the several views thereof:

FIG. 2 is a graphical illustration of a signal generated by a narrow-band amplifier of an apparatus for focusing an objective lens of a scanning transmission-type corpuscular-beam microscope constructed according to the present invention; and FIG. 3 is a graphical illustration of a signal generated by a lens wobble generator in an apparatus for automatically focusing the objective lens of a scanning transmission-type corpuscular-beam microscope constructed according to the present invention.

DETAILED DESCRIPTION

Figure 1:
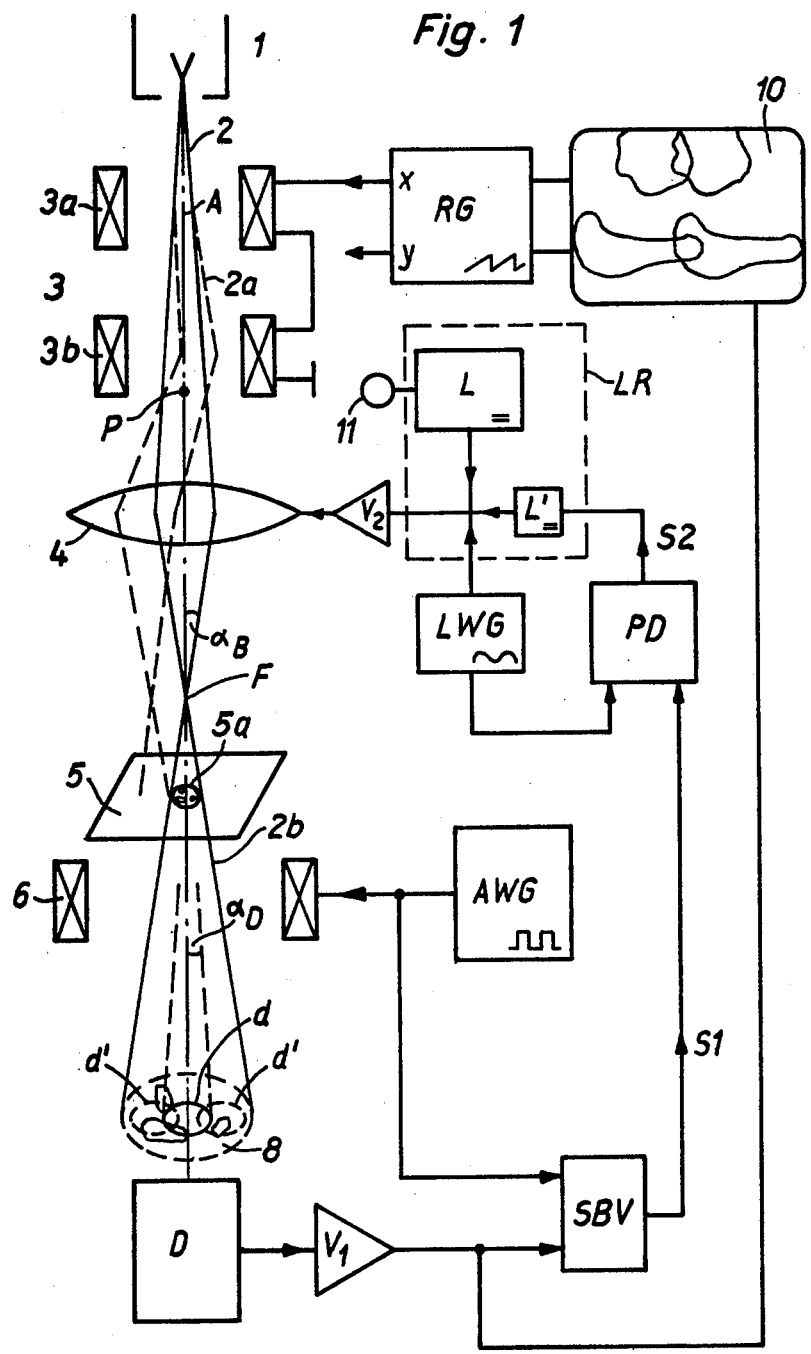
FIG. 1 is a schematic diagram of an apparatus for automatically focusing the objective lens of a scanning transmission-type corpuscular-beam microscope constructed according to the present invention.

Referring now to the drawings, there is shown in FIG. 1, a beam source of a scanning transmission-type microscope, which may comprise, for example, a field emission cathode. A deflection system 3 including deflection stages 3a and 3b, each stage consisting of two pairs of electrostatic deflection plates or, alternatively, magnetic deflection coils, is provided for deflecting the beam of the microscope in two mutually perpendicular directions $x$ and $y$ in raster fashion on the specimen examined. For the purpose of clarity, only the pairs which deflect the beam in the $x$-direction are shown in the drawings. Deflection system 3 is excited by a raster generator RG. Stage 3a of the system deflects beam 2 out of the optical axis A of the microscope and stage 3b deflects the beam back toward the microscope axis. (The path of the deflected beam is identified by reference numeral 2a.)

The beam of the microscope is focused by a magnetic objective lens 4 on a specimen 5 and is tilted by deflection system 3 about a point P disposed in the focal plane of lens 4. Another deflection system 6 and a detector D are disposed underneath specimen 5. Deflection system 6 consists of only one pair of electrostatic deflection plates or, alternatively, magnetic deflection coils. Detector D is coupled by an amplifier V1 to the brightness control of a picture tube monitor 10, the deflection system of which is controlled by raster generator RG.

FIG. 1 illustrates a condition of the microscope in which the focus F of the beam, as a result of excessive excitation of objective lens 4, is not disposed on specimen 5, as it should be, but instead is disposed in front of the specimen along the beam path. Consequently, the beam generates a shadow projection of a specimen area 5a with its downwardly directed cone 2a. In other words, a shadow image of area 5a is produced in the plane 8 in which the input area $d$ of detector D is disposed. It is important that this input area be smaller than the cross-sectional area of the ray cone in plane 8, i.e., the detector aperture $\alpha_D$ must be smaller than the illumination aperture $\alpha_B$.

The shadow image of specimen area 5a generated in plane 8 is structured as the area itself. The same is true when focus F is disposed below specimen 5 if lens 4 is insufficiently excited. In this latter case, a structured image is also produced in plane 8. If, however, the beam focus is disposed on specimen 5, then the ray cone below the specimen is not structured.

Assume first that deflection system 3 is not excited, and that beam 2 therefore always illuminates, when its position is fixed, the same point or area of specimen 5. Deflection system 6 is then excited in two discrete states so that cone 2b is deflected successively to opposite sides of optical axis A, more specifically, so that the axis of the cone forms equal and opposite angles with optical axis A. In the two deflection states, parts of the cone which are disposed symmetrically with respect to the axis of the cone therefore strike the relatively small input area $d$ of detector D. The radiation intensities which are measured by detector D are different when the beam is defocused because of the irregular structure of the shadow image. However, the intensities are equal if focus F is disposed on specimen 5 and cone 2b has no structure. It is thus possible to directly determine by measuring the output signals generated by detector D in the two deflection states whether or not focus F is disposed on specimen 5. If necessary, the excitation of objective lens 4 can be adjusted on the basis of this measurement so that the output signals generated by detector D in the two states are equal. The focus F will then be disposed on the specimen.

In a similar manner, but omitting deflection system 6, two detectors arranged symmetrically with respect to axis A are provided in plane 8. The input areas of these detectors are also smaller than the cross-sectional area of the cone and are identified in FIG. 1 by the dashed lines $d'$. Also in this arrangement, comparison of the output signals generated by the two detectors furnishes a criterion for determining the position of focus F.

That part of the apparatus which automatically focuses the beam includes lens current regulator LR which supplies current to objective lens 4. The regulator consists of a regulating portion L which generates a control signal which is constant in time, and a regulating portion L' which generates a control signal which is additive in the positive or negative sense, but in its final state, is also constant in time. Both signals control an amplifier V2 which transmits the current to objective lens 4. A lens wobble generator LWG is also provided which permits a sinusoidal a-c current to be superimposed upon the line current. Regulating portion L can be set manually by an operating element 11.

Deflection system 6 is excited by a deflection wobble generator AWG which generates a square-wave a-c current output signal. This signal causes cone 2b to be deflected alternately into two positions disposed symmetrical with respect to axis A. The frequency of deflection generator AWG is high compared to the line frequency of raster generator RG at which the $x$-axis deflection direction of deflection system 3 is operated. As a result, two successive deflection states of cone 2b are associated with the same point or area of specimen 5, i.e., successive deflections take place during one image dot period. The frequency of deflection wobble generator AWG is also high compared to the frequency of lens wobble generator LWG. Disregarding any lens wobbling, signal S1, in the case of either over or underfocusing, comprises a voltage, the magnitude of which corresponds to the absolute difference of the detector output signals in both positions of the beam cone, identified by the reference character $a$ in FIG. 2. If low-frequency wobble is now applied to the lens current (see FIG. 3), then signal S1 is modulated by the shape of the lens wobble. The phases of this modulation are different from the lens wobble, depending upon whether or not either overfocusing (2a of FIG. 2) or underfocusing (2c of FIG. 2) is present. If the lens d-c current is adjusted correctly, the maximum distances of focus F from specimen 5 are equal during the lens wobble. Consequently, the modulation of the signal S1 described with reference to FIG. 2b comprises two half-waves, one of which has the same phase and the other of which the opposite phase as the lens wobble. Phase discriminator PD thus generates opposite signals in response to the signals identified by the reference numerals 2a and 2c the polarity of which corresponds to the direction of the focus deviation, which are transmitted to the lens current regulator. In response to signal 2b, the discriminator generates no output signal. After the correct focus is obtained, lens wobble generator LWG and deflection wobble generator AWG are switched off for normal operation of the microscope.

It should be noted that the automatic focusing device described is operative during normal excitation of deflection system 3, i.e., during the usual generation of a raster on specimen 5. An image of the scanned specimen area can thus be viewed on the screen of picture tube monitor 10. As long as focus F is not in the plane of specimen 5, this image is, as shown in FIG. 1, a double image which merges into one image when the focus is correct. It is thus possible to visually check the sate of the focusing on the monitor screen.

Some of the operating parameters for the apparatus illustrated in FIG. 1 are as follows:

| | |
|---|---|
| Exposure aperture: | $\alpha_B \approx 2 \times 10^{-2}$ rad |
| Detector aperture: | $\alpha_D \approx 5 \times 10^{-3}$ rad |
| Raster generator RG: | |
| Frame time | $T_{frame}$ = 4 sec |
| Line time | $t_{line}$ = 20 msec |
| Image dot time | $\tau_{BP}$ = 100 usec |
| Deflection wobble generator AWG: | |
| Period | $\tau$ ⊓⊔⊓ = 50 usec |
| Lens wobble generator LWG: | |
| Period | $\tau$ ∼∼∼ = 40 msec. |

The method as well as the apparatus of the invention may be used to correct astigmatism of the objective lens, since this in principle involves a focus correction in two different planes containing the optical axis of the microscope. To achieve this, deflection system 6, for example, can be rotated effectively in its azimuth by mechanical or electrical means to that the lens current set for correct focusing is the same for all azimuth directions. An additional pair of deflection coils would be required for electrically rotating deflection system 6.

It should be noted that although the invention has been described with reference to scanning transmission-type electron microscopes, it is also applicable to ion microscopes of that type.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a method for focusing the objective lens of a scanning transmission-type corpuscular-beam microscope in which the beam of the microscope is deflected by a deflection system excited in sawtooth fashion and generates a raster consisting of parallel lines on a specimen to be examined, said microscope including a beam radiation detector disposed behind the specimen along the beam path which generates an output signal which controls the brightness of a picture tube monitor operated synchronously with said raster, the improvement comprising the steps of,
measuring, during the exposure of a specimen point, partial beam radiation intensities in a cone of the beam at two points disposed symmetrical with respect to the longitudinal axis of said beam cone by means of said detector, the effective input area of said detector being smaller than the cross-sectional area of said cone at the same height in said microscope, and
adjusting the lens current of the objective lens of said microscope so that output signals generated by said detector are equal for both of said beam radiation measurements at said points thereby focusing said beam on said specimen.

2. The method recited in claim 1, wherein said step of measuring comprises measuring said partial beam radiation intensities by a pair of beam radiation detectors disposed symmetrically with respect to the optical axis of said microscope.

3. The method recited in claim 1, wherein said step of measuring comprises measuring said partial beam radiation intensities by a beam radiation detector disposed in the optical axis of said microscope, and further comprising the step of alternately exciting said deflection system of said microscope in alternating current fashion so as to deflect the microscope beam in two opposite directions through two opposite and equal angles with respect to the optical axis of said microscope, said deflection system deflecting said beam at a deflection frequency which is high compared to the line frequency of said specimen raster.

4. The method recited in claim 3, further comprising the step of amplifying said output signals generated by said detector by a narrow-band amplifier tuned to the frequency of said deflection system.

5. The method recited in claim 3, further comprising the steps of superimposing an alternating current having a frequency which is low compared to said deflection frequency on said lens current, and comparing the phase differences of said alternating current and said deflection output signals to determine the direction of a required lens current change.

6. The method recited in claim 1, further comprising the step of rotating said deflection system in azimuth so that the lens current for correct focusing of said objective lens is the same for all azimuth directions for correcting astigmatism of said objective lens.

7. An apparatus for automatically focusing the objective lens of a scanning transmission-type corpuscular-beam microscope including deflection means for deflecting the beam of said microscope and generating a raster consisting of parallel lines on a specimen to be examined, said apparatus comprising:
beam radiation detector means, disposed behind a specimen to be examined in the microscope along the beam path, on the optical axis of said microscope for measuring partial beam radiation intensities of said beam;
beam deflection means, disposed between said specimen and said radiation detector means;
a wobble generator, coupled to said beam deflection means, for generating a square-wave output signal for deflecting a ray cone of said beam in two deflection directions disposed symmetrical with respect to the optical axis of said microscope, the frequency of said output signal being high compared to the line frequency of said specimen raster;
means, coupled to said objective lens, for regulating the current of said objective lens so that the beam radiation intensities measured by said detector means are equal thereby focusing said beam on said specimen;

a lens current wobble generator, coupled to said lens current regulating means, for superimposing an alternating current on said lens current; and a phase discriminator, coupled to said lens current wobble generator, said lens and said detector means, for comparing the phase between output signals generated by said lens current wobble generator and said detector means, said discriminator generating an output signal for controlling said lens current regulating means.

8. The apparatus recited in claim 7, further comprising means for rotating said deflection system in azimuth so that the lens current for correct focusing of said objective lens is the same for all azimuth directions, for correcting astigmatism of said objective lens.

9. The apparatus recited in claim 8, wherein said rotating means comprises a pair of magnetic deflection coils for electrically rotating said deflection system.

* * * * *